(12) United States Patent
Chun

(10) Patent No.: US 6,867,639 B2
(45) Date of Patent: Mar. 15, 2005

(54) HALF VOLTAGE GENERATOR FOR USE IN SEMICONDUCTOR MEMORY DEVICE

(75) Inventor: Ki-chul Chun, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/648,603

(22) Filed: Aug. 25, 2003

(65) Prior Publication Data

US 2004/0075485 A1 Apr. 22, 2004

(30) Foreign Application Priority Data

Oct. 21, 2002 (KR) .................................. 10-2002-0064245

(51) Int. Cl.[7] .............................................. G05F 1/10
(52) U.S. Cl. ...................................... 327/538; 327/543
(58) Field of Search ................................ 327/427, 530, 327/538, 540, 541, 543, 312, 313, 320, 321, 323, 325, 327, 328, 331, 332; 323/312–316; 365/189.09, 226

(56) References Cited

U.S. PATENT DOCUMENTS

| 4,633,192 A | * | 12/1986 | Anami .......................... 330/277 |
| 5,831,472 A | * | 11/1998 | Wang et al. ................... 327/543 |
| 5,949,284 A | | 9/1999 | Frisch ........................... 330/253 |
| 6,002,601 A | | 12/1999 | Pappalardo et al. ........... 363/71 |
| 6,201,378 B1 | * | 3/2001 | Eto et al. ...................... 323/313 |
| 6,265,858 B1 | * | 7/2001 | Park ............................. 323/313 |
| 6,628,162 B2 | * | 9/2003 | Kondo et al. ................. 327/540 |
| 2002/0075067 A1 | * | 6/2002 | Kondo et al. ................. 327/541 |

* cited by examiner

Primary Examiner—Long Nguyen
(74) Attorney, Agent, or Firm—Marger Johnson & McCollom, P.C.

(57) ABSTRACT

A voltage generator for use in a semiconductor memory device provides a stabilized output voltage of half a supply voltage Vcc. The voltage generator includes a reference voltage generator capable of generating first and second reference voltages. A differential amplification drive circuit is capable of generating an output voltage responsive to the first and second reference voltages. A resistance/diode reference voltage generator is capable of generating third and fourth reference voltages. And a pull-up/down drive is capable of changing the output voltage responsive to the third and fourth reference voltages. The resulting voltage generator provides a stable and accurate output voltage that is resistant to output load variations.

15 Claims, 3 Drawing Sheets

HALF VOLTAGE GENERATOR FOR USE IN SEMICONDUCTOR MEMORY DEVICE

This application claims priority from Korean Application No. 2002-64245 filed Oct. 21, 2002, incorporated herein by reference.

BACKGROUND OF THE INVENTION

1. Field of the Invention

The present invention relates to a semiconductor device and, more particularly, to a half voltage generator for use in a semiconductor memory device.

2. Description of the Related Art

In a read operation of a semiconductor memory device, data stored in a memory cell is sensed and amplified by a sense amplifier (S/A) that is connected to a bitline (BL) and a complementary bitline (BLB), and externally provided. After the S/A's sense and amplification operations, the device precharges the BL and BLB to a predetermined level. The precharge operation is classified broadly into two methods. The first method is to precharge the BL to a voltage source VCC and the BLB to a ground voltage VSS. The second method is to precharge the BL and BLB to a half voltage source VCC or Half VCC. The first method is called a full voltage source precharge and the second method is called a half voltage source precharge. The full VCC precharge consumes more power than the half VCC precharge, thus most of semiconductor memory devices employ the half VCC precharge method. To execute the half VCC precharge method, a half voltage source (half VCC) generator is needed within the chip.

FIG. 1 shows a circuit diagram of a conventional half VCC generator. Referring to FIG. 1, the half VCC generator includes two MOS resistances MP0 and MN0, two diodes MN1 and MP1, a pull-up driver MN2, and a pull-down driver MP2. A voltage at a node NDA is set by a resistance ratio of the MOS resistances MP0 and MN0, and the drivers voltage of the node NDA is applied to each of gates of the pull-up and pull-down drivers MN2, MP2 through two diodes MP1 and MN1. The pull-up and pull-down drivers operate by a voltage level applied to each gate thereof to thus output a half voltage VBL. That is, a level of the outputted VBL is traced to a voltage level of the node NDA.

In FIG. 1, the VBL is commonly fed back to each of gates of the two MOS resistances MP0 and MN0. When a level of the VBL becomes a half level of the voltage source VCC and thus a size of transistors of the MOS resistances MP0 and MN0 is adjusted so that the voltage level of the NDA becomes the half VCC, a voltage by a threshold of respective diodes is applied to each of gates of the pull-up and pull-down drivers MN2 and MP2. To set the VBL, the size of the MOS transistors MP0 and MN0 is adjusted so that the voltage at NDA becomes half VCC. Once a level of the outputted VBL is deviated from the half VCC, resistance values of the two MOS resistances MP0 and MN0 are changed by a feedback operation, and thus a voltage level of the NDA is also changed. The changed voltage level changes a gate voltage of the pull-up and pull-down drivers MN2 and MP2, to thus stably maintain a level of the VBL of an output terminal as a level of the half VCC.

A tendency toward improved semiconductor technology and for a low-power memory, results in lowering VCC. The conventional half VCC generator, however, is limited by the two transistors MP0 and MN0 being used as the resistances. Transistors MP0 and MN0 might turn off as VCC is lower than a predetermined level. In other words, the two transistors MP0 and MN0 receive the half VCC as a gate voltage and this voltage is gradually lowered, resulting in one of the transistors turning off thereby improperly operating the voltage generator.

The half VCC generator shown in FIG. 1 has an advantage that the two drivers MN2 and MP2 do not turn on at the same time when a level of the half voltage is above a threshold voltage Vt of the transistor. Thus a standby current is small and a level of a determined half voltage can be maintained more precisely.

FIG. 2 shows another conventional half Vcc generator. Referring to FIG. 2, the voltage generator employs two differential amplifiers DA1 and DA2 to drive driver transistors. Thus, the voltage generator has a great driving capability as compared with the circuit of FIG. 1. Also the circuit of FIG. 2 has a low-voltage limitation of 1Vt+Vds_sat in comparison with that the circuit of FIG. 1, which has a low-voltage limitation of 2Vt. There is, therefore, an advantage that the circuit of FIG. 2 has a low limitation for the low-voltage and a high driving force, but a disadvantage that both transistors MP12 and MN12 turn "ON" at the same time. This causes a leakage current to flow that causes the output voltage at node NDB to oscillate.

The conventional half voltage source generators, therefore, might have a low driving capability, not be capable of a low-voltage operation, contain a leakage current flow, and cause oscillation at an output node. Accordingly, a need exists for an improved half voltage source generator.

SUMMARY OF THE INVENTION

According to exemplary embodiments of the present invention, a half voltage source generator accurately provides a half voltage source with a high driving force, maintains a stabilized half voltage source level, responds speedily to a load variation of an output node, and is reliable and stable.

According to an exemplary embodiment of the present invention, a voltage generator for use in a semiconductor memory device provides a stabilized output voltage of half a supply voltage Vcc. The voltage generator includes a reference voltage generator capable of generating first and second reference voltages. A differential amplification drive circuit is capable of generating an output voltage responsive to the first and second reference voltages. A resistance/diode reference voltage generator is capable of generating third and fourth reference voltages. And a pull-up/down drive is capable of changing the output voltage responsive to the third and fourth reference voltages. The resulting voltage generator provides a stable and accurate output voltage that is resistant to output load variations.

BRIEF DESCRIPTION OF THE DRAWINGS

The above and other features of the present invention will become readily apparent from the description of exemplary embodiments that follows with reference to the accompanying drawings.

PREFERRED EMBODIMENT OF THE INVENTION

Hereinafter, preferred embodiments of the present invention will be described in detail with reference to FIGS. 3 through 5.

Figure 1:
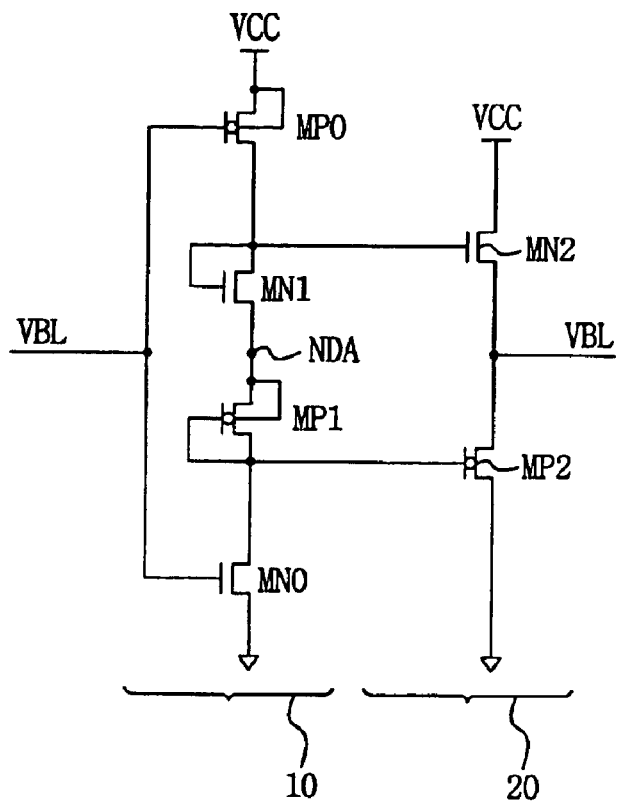
FIGS. 1 and 2 are circuit diagrams of conventional half voltage source generators.
Figure 2:
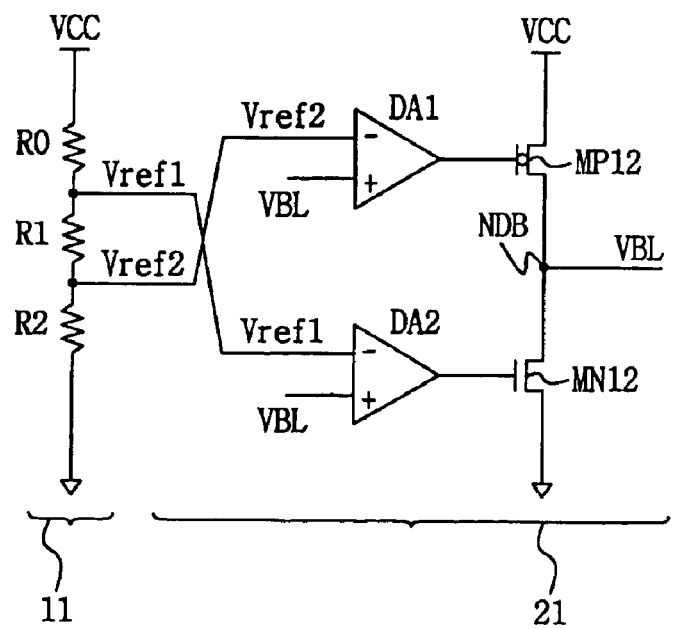
Figure 3:
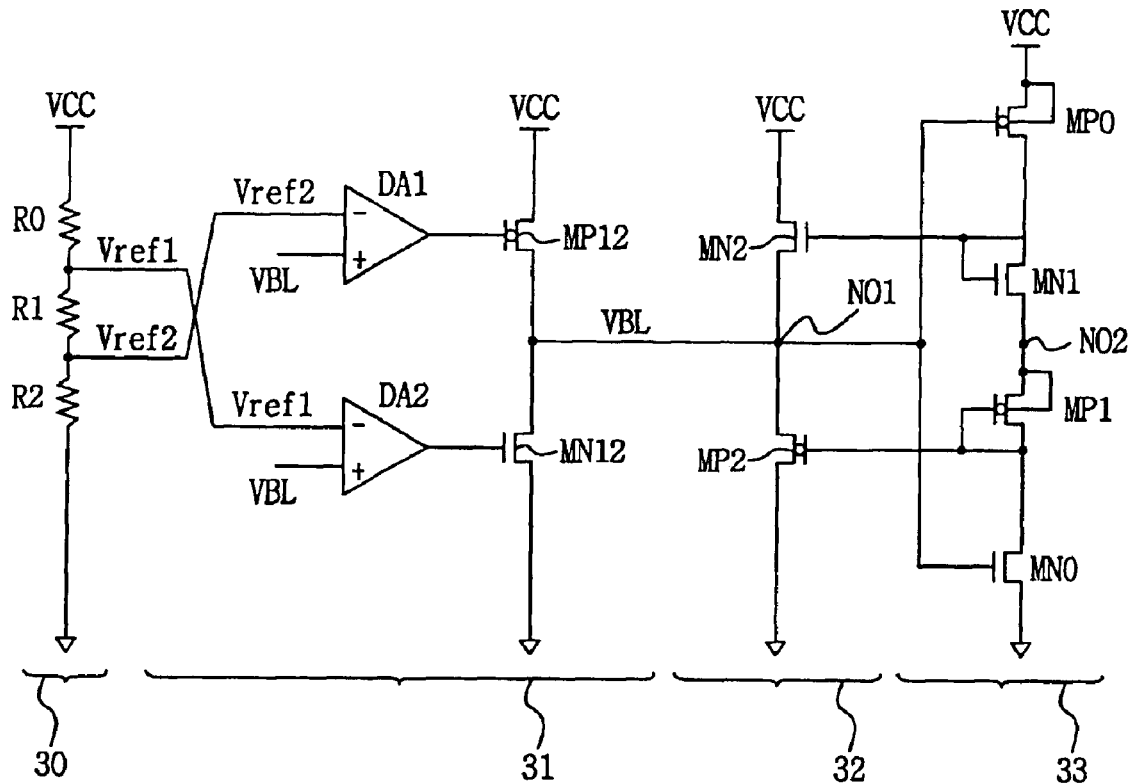
FIGS. 3 through 5 are circuit diagrams of embodiments of half voltage source generators according to the present invention.
Figure 4:
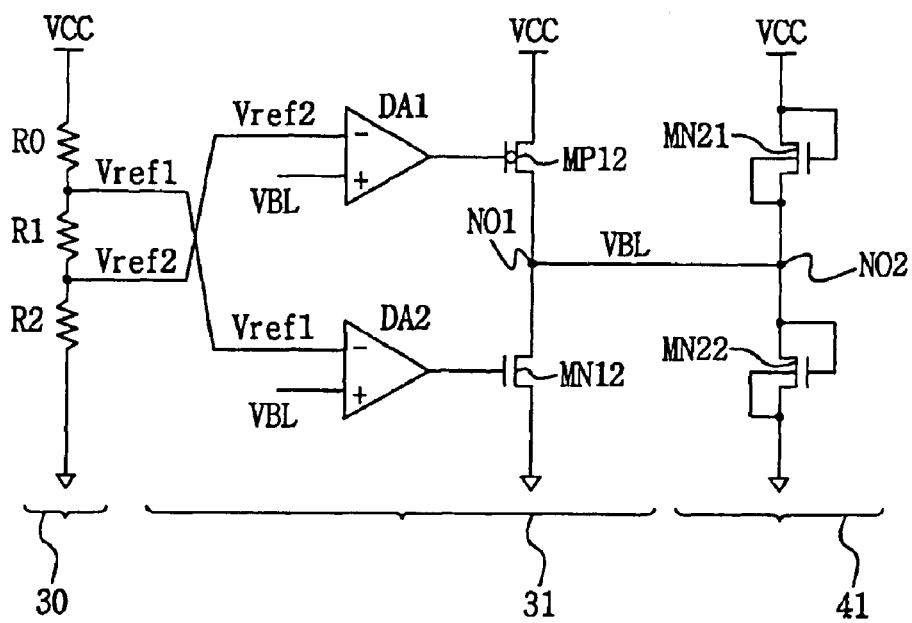
Figure 5:
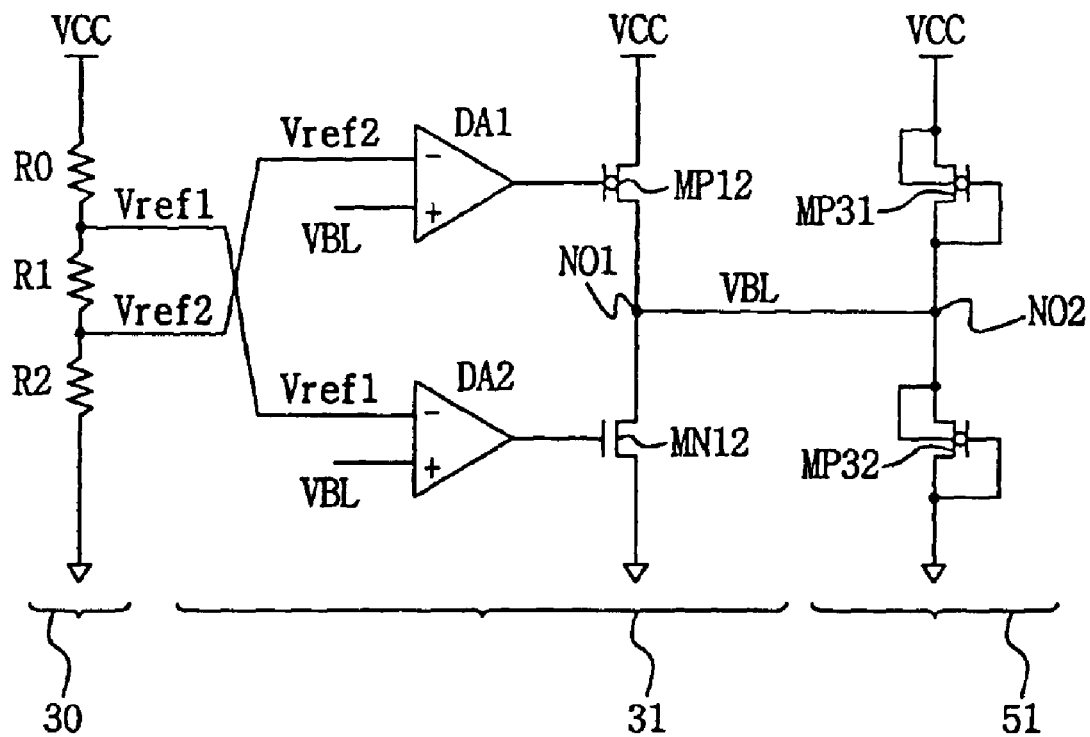

The elements described in FIGS. 3 through 5 in accordance with the exemplary embodiments of the present invention, which are similar to those described with respect to FIGS. 1 and 2, will be provided with the same or similar reference symbols.

FIGS. 3 to 5 are circuit diagrams of half voltage source generators of various exemplary embodiments according to the present invention.

Referring first to FIG. 3, the generator includes a reference voltage generator 30, a differential amplification drive 31, a pull-up/down drive 32, and a MOS resistance/diode reference voltage generator 33.

The reference voltage generator 30 is constructed of a first resistance R0 that is connected between a power terminal and a first node for generating a first reference voltage Vref1, a second resistance R1 that is connected between the first node and a second node for generating a second reference voltage Vref2, and a third resistance R2 that is connected between the second node and a ground terminal.

The differential amplification drive 31 includes a first differential amplifier DA1. The first differential amplifier DA1 has one input coupled with the second node and another input coupled with an output terminal that is connected thereto in a negative feedback type. A second differential amplifier DA2 has one input connected to the first node and another input connected to the output terminal in a negative feedback type. A first pMOS transistor MP12 has a source coupled with the power terminal, a drain coupled with the output terminal, and has a gate coupled to an output of the first differential amplifier. And a first nMOS transistor MN12 having a drain connected to the output terminal, a source connected to the ground terminal, and a gate connected to an output of the second differential amplifier.

The pull-up/down drive 32 comprises a second nMOS transistor MN2 having a drain coupled with the power terminal and a source connected to the output terminal. A second pMOS transistor MP2 has a source coupled with the output terminal and a drain coupled with the ground terminal.

The MOS resistance/diode reference voltage generator 33 includes a third pMOS transistor MP0 having a source connected to the power terminal, a gate coupled with the output terminal, and a drain coupled with a gate of the second nMOS transistor MN2. A third nMOS transistor MN1 has a drain and gate commonly connected to the drain of the third pMOS transistor MP0. A fourth pMOS transistor MP1 has a source connected to a source of the third nMOS transistor MN1 and a gate and drain coupled with the gate of the second pMOS transistor MP2. And a fourth nMOS transistor is MN0 having a coupled with the output terminal, a drain coupled with the drain of the fourth pMOS transistor MP1, and a source coupled with the ground terminal.

In the circuit of FIG. 3, the first reference voltage Vref1 is equal to $(Vcc*(R1+R2))/(R0+R1+R2)$. If $R0=R2$ and $R1<<R0,R2$, Vref1 is greater than the half VCC by $R1/((R0+R1+R2)/2)$. And, the Vref2 is smaller than the half Vcc by $R1/((R0+R1+R2)/2)$. The first differential amplifier DA1, therefore, a low state output the drive transistor MP12 when a level of the output terminal VBL is smaller than $Vcc/2-R1/((R0+R1+R2)/2)$. A charge is supplied from the power terminal to a VBL node to increase a voltage at VBL. The second differential amplifier DA2 has a high state output turning on the drive transistor MN12 when the VBL is higher than $Vcc/2+R1/((R0+R1+R2)/2)$. A charge flows from the VBL node to the ground terminal to decrease a voltage of the VBL. Put differently, if the VBL node is at a voltage within $Vcc/2 \pm R1/((R0+R1+R2)/2)$, the transistors MP12 and MN12 are simultaneously turned off and the VBL node floats. This prevents a leakage current from flowing from the transistor MP12 to the transistor MN12 by an offset of the differential amplifier.

Current developments in semiconductor process technology tend toward device scale down to gradually increase an offset of the differential amplifier. To compensate for this offset, a floating section of the VBL node must become larger.

The voltage generator of FIG. 3 including the pull-up/down drive 32 and the MOS resistance/diode reference voltage generator 33, does not operate with two transistors simultaneously turned on because a gate voltage of the driver transistors MN2 and MP2 always changes in the same direction as the VBL node voltage. Thus, the half Vcc voltage generator of can accurately maintain the VBL node at half the VCC level.

As described above, the circuit of FIG. 3 has high driving force and accurately maintains a half Vcc level.

Even though the resistance R1 used in the circuit of FIG. 3 is provided as a large value in comparison with a resistance value provided in FIG. 1, the VBL node is maintained with a stabilized level without a floating section by combining two types of voltage generators.

Other exemplary embodiments of the present invention are shown in FIGS. 4 and 5. These diagrams show circuits that use the high driving force of the half Vcc voltage generator using the differential amplifier together with a resistance of a diode connection type so as to prevent the VBL from floating.

Referring to FIG. 4, the pull-up/down drive 32 shown in FIG. 3 is omitted. N-type MOS diodes MN21 and MN22 are connectively configured, functioning as a resistance element instead of the MOS resistance/diode reference voltage generator 33.

Referring to FIG. 5, the pull-up/down drive 32 of FIG. 3 is omitted. P-type MOS diodes MP31 and MP32 functioning as a resistance element instead of the MOS resistance/diode reference voltage generator 33 are configured connectively.

In FIGS. 4 and 5, the VBL node maintains a stabilized level without the "floating" section, thereby obtaining a high driving force and an exact preserving force of the half Vcc level.

The half Vcc generator responds to a load variation of an output node at a high speed and simultaneously maintains a stabilized half voltage level, whereby providing a high driving force and an accurate level of a half source voltage.

Although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims. According to some cases, it is, of course, valid that an internal connection configuration of a circuit may become different therefrom.

I claim:

1. A voltage generator, comprising:
    a first reference voltage generator to generate first and second reference voltages;
    a differential amplification drive circuit to generate an output voltage responsive to the first and second reference voltages and the output voltage;

a second reference voltage generator to generate third and fourth reference voltages; and a drive circuit to change the output voltage responsive to the third and fourth reference voltages, the drive circuit having a first and second node, the third reference voltage connected to the first node and the fourth reference voltage connected to the second node.

2. The voltage generator of claim 1 where the first reference voltage generator comprises a plurality of serially connected resistance elements.

3. The voltage generator of claim 1 where the differential amplification drive circuit comprises:
   a first differential amplifier to generate a first drive signal by comparing the second reference voltage with the output voltage;
   a second differential amplifier to generate a second drive signal by comparing the first reference voltage with the output voltage;
   a first drive transistor to drive the output voltage responsive to the first drive signal; and
   a second drive transistor to drive the output voltage responsive to the second drive signal.

4. The voltage generator of claim 1 where the second reference voltage generator comprises a plurality of serially connected transistors connected between a voltage source and ground.

5. The voltage generator of claim 4 where the serially connected transistors are MOS transistors.

6. The voltage generator of claim 5 where the second reference voltage generator generates the third and fourth reference voltages according to a size of the serially connected MOS transistors.

7. The voltage generator of claim 1 where the drive circuit comprises a plurality of serially connected transistors commonly connected to the output voltage.

8. The voltage generator of claim 1 where the first reference voltage has a voltage level greater than the second reference voltage.

9. The voltage generator of claim 1 where the second reference voltage generator comprises a plurality of serially connected resistance elements.

10. A voltage generator, comprising:
    a first resistance element connected between a power terminal and a first node;
    a second resistance element connected between the first node and a second node;
    a third resistance element coupled between the second node and a ground terminal;
    a first differential amplifier having a first input connected to the second node and a second input connected to an output terminal;
    a second differential amplifier having a first input connected to the first node and a second input connected to the output terminal;
    a first pMOS transistor having a source, drain, and gate, the source being connected to the power terminal, the drain being connected to the output terminal, and the gate being connected to an output of the first differential amplifier;
    a first nMOS transistor having a source, drain, and gate, the source being connected to the ground terminal, the drain being connected to the output terminal, and the gate being connected to an output of the second differential amplifier;
    a second nMOS transistor having a source, drain, and gate, the source being connected to the output terminal and the drain being connected to the power terminal;

a second pMOS transistor having a source, drain, and gate, the source being connected to the output terminal and the drain being connected to the ground terminal;

a third pMOS transistor having a source, drain, and gate, the source being connected to the power terminal, the drain being connected to a gate of the second nMOS transistor, and the gate being connected to the output terminal;

a third nMOS transistor having a source, drain, and gate, the drain and gate being commonly connected to the drain of the third pMOS transistor;

a fourth pMOS transistor having a source, drain, and gate, the source being connected to a source of the third nMOS transistor and the gate and drain are commonly connected to the gate of the second pMOS transistor; and a fourth nMOS transistor having a source, drain, and gate, the source being connected to the ground terminal, the drain being connected to the drain of the fourth pMOS transistor, and the gate being connected to the output terminal.

11. A voltage generator, comprising:
    a first resistance element connected between a power terminal and a first node;
    a second resistance element coupled between the first node and a second node;
    a third resistance element coupled between the second node and a ground terminal;
    a first differential amplifier having a first input connected to the second node and a second input directly connected to an output terminal;
    a second differential amplifier having a first input connected to the first node and a second input directly connected to the output terminal;
    a first pMOS transistor having a source, drain, and gate, the source being connected to the power terminal, the drain being connected to the output terminal, and the gate being connected with an output of the first differential amplifier;
    a first nMOS transistor having a source, drain, and gate, the source being connected to the output terminal, the drain being connected to the ground terminal, and the gate being connected to an output of the second differential amplifier;
    a fourth resistance element connected between the power terminal and the output terminal; and
    a fifth resistance element connected between the output terminal and the ground terminal.

12. The generator of claim 11 where the fourth and fifth resistance elements are N-type MOS diodes.

13. The generator of claim 11 where the fourth and fifth resistance elements are P-type MOS diodes.

14. A voltage generator, comprising:
    a first resistance element connected between a power terminal and a first node;
    a second resistance element coupled between the first node and a second node;
    a third resistance element coupled between the second node and a ground terminal;
    a first differential amplifier having a first input connected to the second node and a second input directly connected to an output terminal;
    a second differential amplifier having a first input connected to the first node and a second input directly connected to the output terminal;

a first pMOS transistor having a source, drain, and gate, the source being connected to the power terminal, the drain being connected to the output terminal, and the gate being connected with an output of the first differential amplifier;

a first nMOS transistor having a source, drain, and gate, the source being connected to the output terminal, the drain being connected to the ground terminal, and the gate being connected to an output of the second differential amplifier;

a first N-type MOS diode connected between the power terminal and the output terminal; and a second N-type MOS diode connected between the output terminal and the ground terminal.

15. A voltage generator, comprising:

a first resistance element connected between a power terminal and a first node;

a second resistance element coupled between the first node and a second node;

a third resistance element coupled between the second node and a ground terminal;

a first differential amplifier having a first input connected to the second node and a second input directly connected to an output terminal;

a second differential amplifier having a first input connected to the first node and a second input directly connected to the output terminal;

a first pMOS transistor having a source, drain, and gate, the source being connected to the power terminal, the drain being connected to the output terminal, and the gate being connected with an output of the first differential amplifier;

a first nMOS transistor having a source, drain, and gate, the source being connected to the output terminal, the drain being connected to the ground terminal, and the gate being connected to an output of the second differential amplifier;

a first P-type MOS diode connected between the power terminal and the output terminal; and a second P-type MOS diode connected between the output terminal and the ground terminal.

* * * * *